(12) United States Patent
Imthurn (10) Patent No.: US 9,780,189 B2
(45) Date of Patent: Oct. 3, 2017

(54) TRANSISTOR WITH CONTACTED DEEP WELL REGION

(71) Applicant: Silanna Asia Pte Ltd, Singapore OT (SG)

(72) Inventor: George Imthurn, San Diego, CA (US)

(73) Assignee: Silanna Asia Pte Ltd, Singapore (SG)

(*) Notice: Subject to any disclaimer, the term of this patent is extended or adjusted under 35 U.S.C. 154(b) by 0 days.

(21) Appl. No.: 14/730,092

(22) Filed: Jun. 3, 2015

(65) Prior Publication Data

US 2016/0359016 A1    Dec. 8, 2016

(51) Int. Cl.

| | |
|---|---|
| *H01L 29/66* | (2006.01) |
| *H01L 29/40* | (2006.01) |
| *H01L 29/78* | (2006.01) |
| *H01L 29/06* | (2006.01) |
| *H01L 29/10* | (2006.01) |
| *H01L 21/225* | (2006.01) |
| *H01L 21/283* | (2006.01) |
| *H01L 29/423* | (2006.01) |

(52) U.S. Cl.
CPC .... *H01L 29/66492* (2013.01); *H01L 21/2253* (2013.01); *H01L 21/283* (2013.01); *H01L 29/0692* (2013.01); *H01L 29/1095* (2013.01); *H01L 29/402* (2013.01); *H01L 29/4238* (2013.01); *H01L 29/66659* (2013.01); *H01L 29/7833* (2013.01); *H01L 29/7835* (2013.01)

(58) Field of Classification Search
CPC .......... H01L 29/66492; H01L 29/7833; H01L 29/4238; H01L 29/0692; H01L 21/283; H01L 21/2253

USPC ......................................................... 257/344
See application file for complete search history.

(56) References Cited

U.S. PATENT DOCUMENTS

| | | | |
|---|---|---|---|
| 4,738,936 A | 4/1988 | Rice | |
| 4,939,104 A | 7/1990 | Pollack et al. | |
| 5,821,144 A | 10/1998 | Hebert | |
| 5,869,875 A | 2/1999 | Hebert | |
| 6,049,108 A | 4/2000 | Williams et al. | |
| 6,078,090 A | 6/2000 | Williams et al. | |
| 7,420,247 B2 | 9/2008 | Xu et al. | |
| 8,674,440 B2 | 3/2014 | Korec et al. | |

(Continued)

OTHER PUBLICATIONS

International Search Report and Written Opinion dated Aug. 23, 2016 for PCT Patent Application No. PCT/IB2016/053197.

*Primary Examiner* — Hrayr A Sayadian
(74) *Attorney, Agent, or Firm* — The Mueller Law Office, P.C.

(57) ABSTRACT

Various methods and devices that involve body contacted transistors are disclosed. An exemplary method comprises forming a gate on a planar surface of a semiconductor wafer. The gate covers a channel of a first conductivity type that is opposite to a second conductivity type. The method also comprises implanting a body dose of dopants on a source side of the gate using the gate to mask the body dose of dopants. The body dose of dopants spreads underneath the channel to form a deep well. The body dose of dopants has the first conductivity type. The method also comprises implanting, subsequent to implanting the body dose of dopants, a source dose of dopants on the source side of the gate to form a source. The method also comprises forming a source contact that is in contact with the deep well at the planar surface of the semiconductor wafer.

7 Claims, 10 Drawing Sheets

(56) References Cited

U.S. PATENT DOCUMENTS

| | | |
|---|---|---|
| 2003/0025155 A1 | 2/2003 | Rumennik et al. |
| 2005/0098846 A1 | 5/2005 | Nagaoka |
| 2008/0182394 A1 | 7/2008 | Yang et al. |
| 2010/0078720 A1 | 4/2010 | Fujii |
| 2013/0126983 A1* | 5/2013 | Bulucea ............ H01L 21/82380 257/402 |

* cited by examiner

TRANSISTOR WITH CONTACTED DEEP WELL REGION

BACKGROUND OF THE INVENTION

Semiconductor power devices are specialized devices that are used as switches or rectifiers in power electronics circuits. They are characterized by their ability to withstand high voltages and large currents as well as the high temperatures associated with high power. As such, certain problems faced by standard transistors when they are operated in high voltage conditions are of particular concern in the realm of power transistors. In addition, the conditions under which a transistor breaks due to the application of large voltages or currents must be carefully scrutinized when designing a power device.

Device breakdown is a term used to describe various issues faced by devices when a certain point is reached at which their performance alters in a nonlinear fashion. One example of device breakdown is the "kink effect" which results from an increase in the body potential of a field effect transistor. However, breakdown is not a phenomenon that is limited to field effect transistors as there are known breakdown modes for nearly all semiconductor devices including bipolar junction transistors, diodes, resistors, capacitors, and generally all transistor and rectifier devices.

Figure 1:
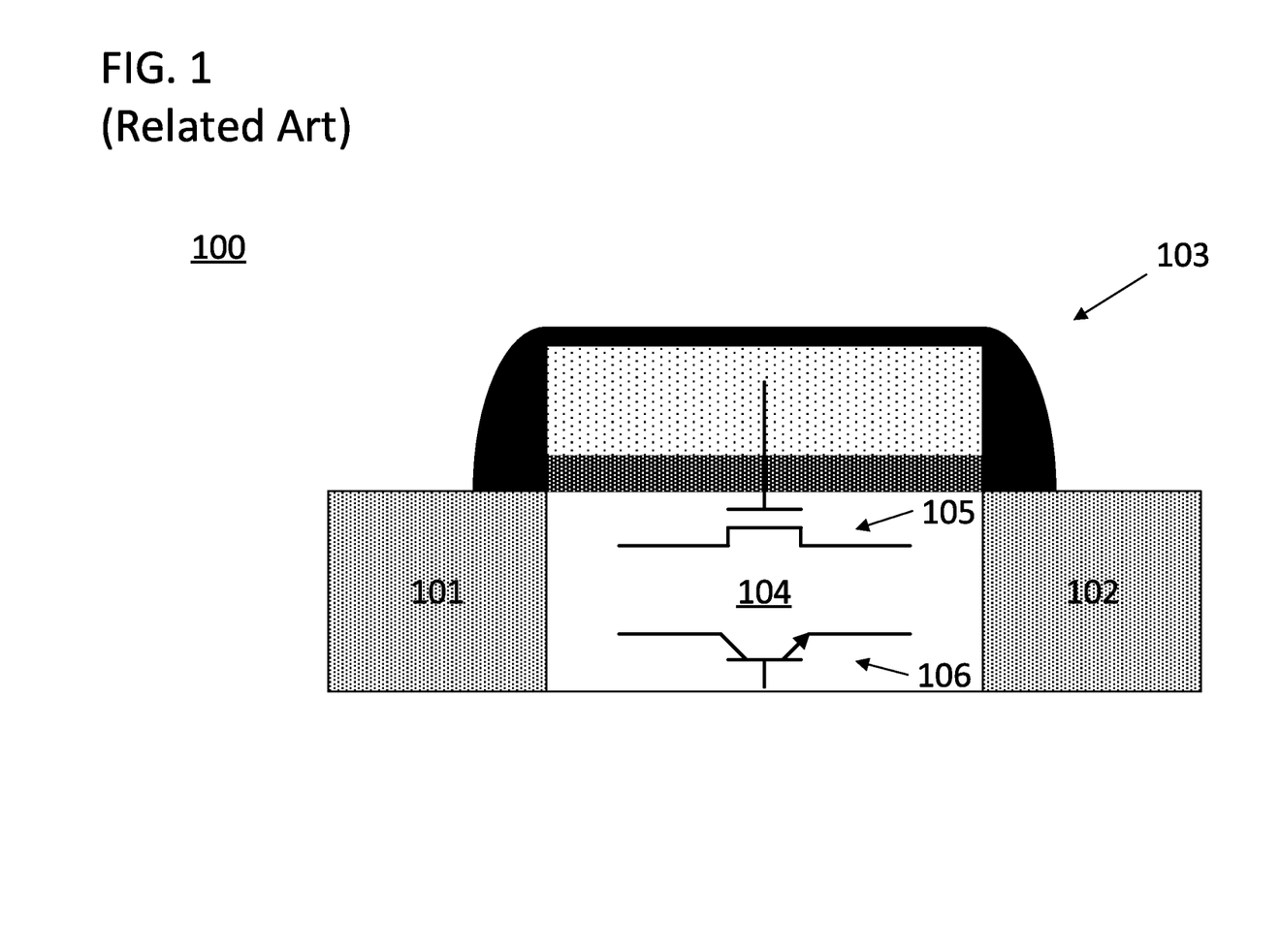
FIG. 1 illustrates a cross section of a transistor with circuit schematic elements drawn over the cross section to describe one type of breakdown mode in transistors.

The kink effect can be explained with reference to FIG. 1 which includes a cross section 100 of a semiconductor device. The field effect transistor in cross section 100 provides a conductive path between source region 101 and drain region 102 in response to a voltage applied to the device via an isolated gate electrode in gate stack 103. The conductive path is formed through body region 104. The conductive path includes a channel through body region 104. A schematic of this field effect transistor 105 has been drawn over cross section 100 to illustrate its operation relative to the cross section. The conductivity types of source and drain regions 101, 102 are the opposite of the conductivity type of body region 104. As a result, cross section 100 can also represent a parasitic BJT where body region 104 serves as the base of the BJT. A schematic of this parasitic BJT 106 has been drawn over cross section 100 to illustrate its operation relative to the cross section. The kink effect occurs when the parasitic BJT is activated by a build-up of charge in body region 104 caused by charge carriers associated with field effect transistor 105 as it is operated in a high power regime. Although device breakdown is sometimes used intentionally as part of a design, it is more often a point of operation that designs are meant to avoid.

SUMMARY OF INVENTION

In one embodiment, a transistor is provided. The transistor comprises an insulating layer located on a planar surface of an active layer. The transistor also comprises a gate electrode located on the insulating layer. A plan view overlap of the gate electrode and the insulating layer encompasses a channel region in a body region in the active layer. The transistor also comprises a source region in contact with the body region and located on the planar surface of the active layer. The body region and the source region have opposite conductivity types. The transistor also comprises a deep well region in contact with the source region and the body region. The deep well region and the source region have opposite conductivity types. The transistor also comprises a source contact that is in contact with the deep well region and the source region. The source contact is in contact with the deep well region at the planar surface of the active layer.

In another one embodiment, a method is provided. The method comprises forming a gate for the transistor on a surface of a wafer. The method also comprises forming a dielectric overlayer over the gate. The method also comprises patterning the dielectric overlayer with an asymmetric pattern over the transistor. The asymmetric pattern exposes a source side of the transistor to form an exposed region of the surface of the wafer on the source side of the transistor but does not expose a drain side of the transistor. The method also comprises implanting a body dose of dopants into the exposed region of the surface of the wafer. The body dose of dopants spreads underneath the gate to form a deep well for the transistor. The body dose of dopants has a first conductivity type. The method also comprises implanting, subsequent to implanting the body dose of dopants, a source dose of dopants on the source side of the transistor to form a source region for the transistor. The method also comprises implanting, subsequent to implanting the source dose of dopants, a body contact dose of dopants into the exposed region of the surface of the wafer. The body contact dose of dopants forms a body contact region of the deep well that extends from the surface of the wafer to below the source region. The method also comprises conducting only one of: (i) forming a source contact for the transistor that is in contact with the deep well at the body contact region; and (ii) forming a source contact and gate shield for the transistor that are in contact with each other wherein the gate shield is in contact with the deep well at the body contact region.

In another embodiment, a method is provided. The method comprises forming a gate on a planar surface of a semiconductor wafer. The gate covers a channel of a first conductivity type that is opposite to a second conductivity type. The method also comprises implanting a body dose of dopants on a source side of the gate using the gate to mask the body dose of dopants. The body dose of dopants spreads underneath the channel to form a deep well. The body dose of dopants has the first conductivity type. The method also comprises implanting, subsequent to implanting the body dose of dopants, a source dose of dopants on the source side of the gate to form a source. The method also comprises forming a source contact that is in contact with the deep well at the planar surface of the semiconductor wafer.

DETAILED DESCRIPTION OF THE EMBODIMENTS

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

Semiconductor devices disclosed herein have improved performance in high power conditions. However, the teachings disclosed herein can be used to improve semiconductor devices generally and are not limited to high power applications. Certain methods disclosed herein allow for a cost effective and efficient manner in which to build the disclosed devices. In the particular situations in which the semiconductor device is a transistor, the body of the device is efficiently biased to prevent the device from entering into particular breakdown conditions such as those caused by an increase in the potential of the body of the transistor. Some of these semiconductor devices are therefore useful in situations in which the devices are formed in a thin layer of active material because it is in those situations in which the body of the semiconductor device is more susceptible to the introduction of exogenous charge, as there is less intrinsic charge in the thin active region to counteract its effect.

Figure 2:
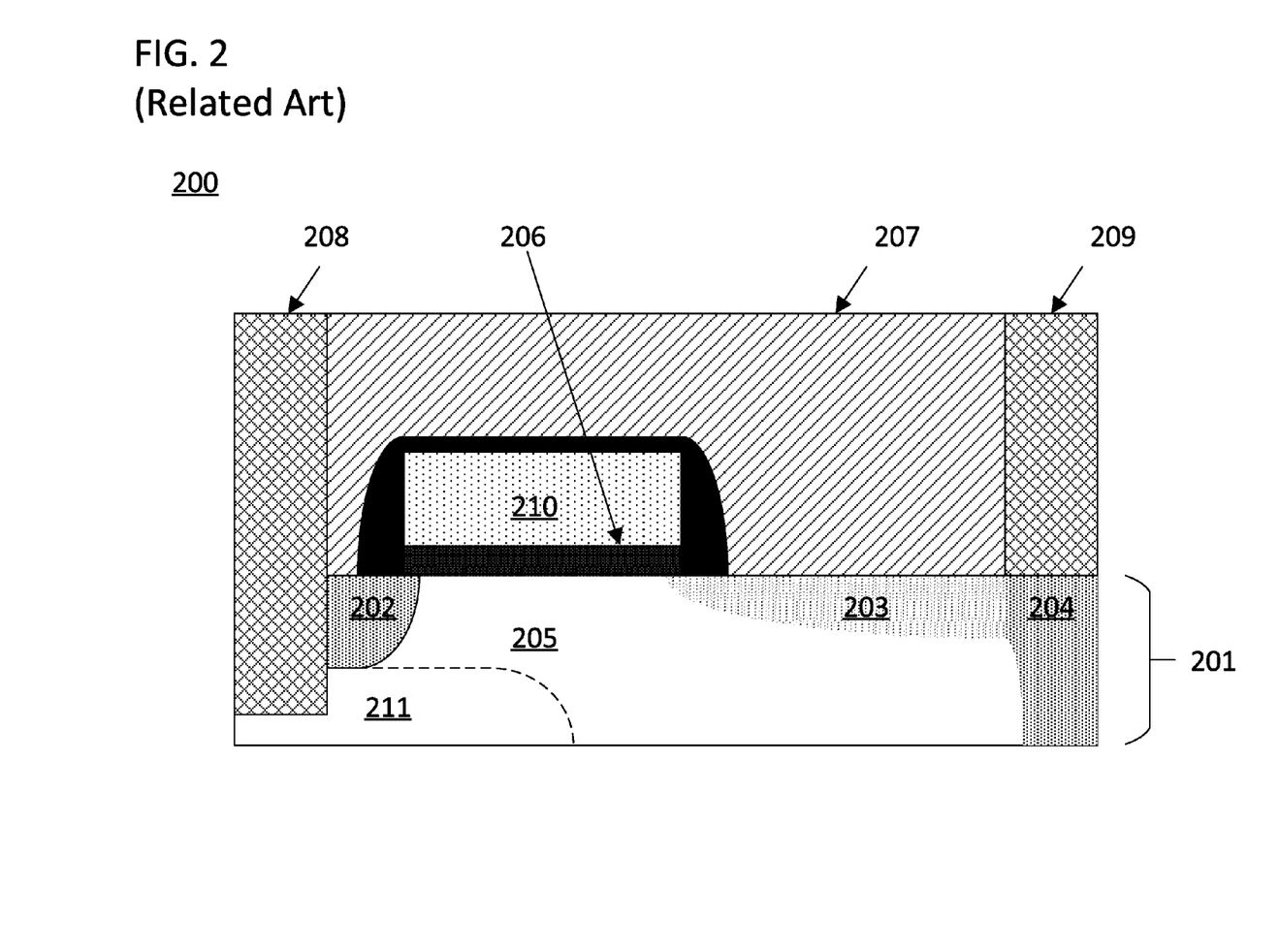
FIG. 2 illustrates a cross section of a transistor with a deep well body contact.

FIG. 2 illustrates a cross section 200 of a transistor that is designed for high voltage applications. Cross section 200 illustrates an active layer 201 of a semiconductor wafer. Active layer 201 is a region of a semiconductor substrate that includes activated silicon which has had its conductivity type altered from a base line value in order to be more conductive for charge carriers having a particular conductivity type. In the illustrated example, the remainder of the substrate is not shown, but depending upon the characteristics of the semiconductor wafer, active layer 201 could be located on the insulating layer of an SOI wafer or it could be located on the top of a bulk semiconductor wafer. As illustrated, active layer 201 includes a source region 202 that is located on a planar surface of active layer 201. Source region 202 is isolated from lightly doped drain region 203 and drain region 204 by body region 205. An insulating layer 206 is located on the planar surface of active layer 201. A gate electrode 210 is located on insulating layer 206. Cross section 200 also includes a second insulating layer 207 located on the planar surface of active layer 201. However, insulating layer 206 and 207 may be formed using the same or similar materials. In addition, in certain approaches the combination of insulating layer 206 and insulating layer 207 can be conceptualized as a single insulating layer in the finished device regardless of when and how they are formed.

The general operation of the transistor in cross section 200 can also be explained with reference to FIG. 2. A conductive path is formed between source contact 208 and drain contact 209 in response to the application of a voltage to gate electrode 210. Gate electrode 210 is located on insulating layer 206. The conductive path between source contact 208 and drain contact 209 includes a channel that is selectively formed in body region 205 under the influence of the aforementioned voltage applied to gate electrode 210. While the channel is formed, the transistor is said to be on. While the channel is not formed, and there is no conductive path between source contact 208 and drain contact 209, the transistor is said to be off. There is no conductive path in this situation because source region 202 and drain regions 203, 204 have an opposite conductivity type to body region 205 such that diode junctions are formed at their interfaces. A plan view overlap of gate electrode 210 and insulating layer 206 encompasses the channel region in body region 205 in active layer 201 when the transistor is on.

The transistor in cross section 200 differs from the transistor in cross section 100 as it exhibits certain characteristics that make it more suitable for handling large voltages. For example, cross section 200 includes lightly doped drain region 203 which is in contact with body region 205 and is located on the planar surface of active layer 201. Body region 205 and lightly doped drain region 203 are materials of opposite conductivity types. Lightly doped drain region 203 is less heavily doped than source region 202. Lightly doped drain region 203 is included to enhance the ability of the transistor to withstand large voltages across source contact 208 and drain contact 209 when the transistor is off. Cross section 200 also includes a deep well region 211 that is in contact with source region 202 and body region 205. Deep well region 211 extends laterally underneath source region 202 and the portion of body region 205 in which a channel forms. Deep well region 211 also enhances the ability of the transistor to withstand large voltages, but plays a more critical role during the on state of the transistor. Deep well region 211 serves to remove unwanted charge carriers from body region 205 to prevent the parasitic bipolar of cross section 200 from activating.

Figure 3:
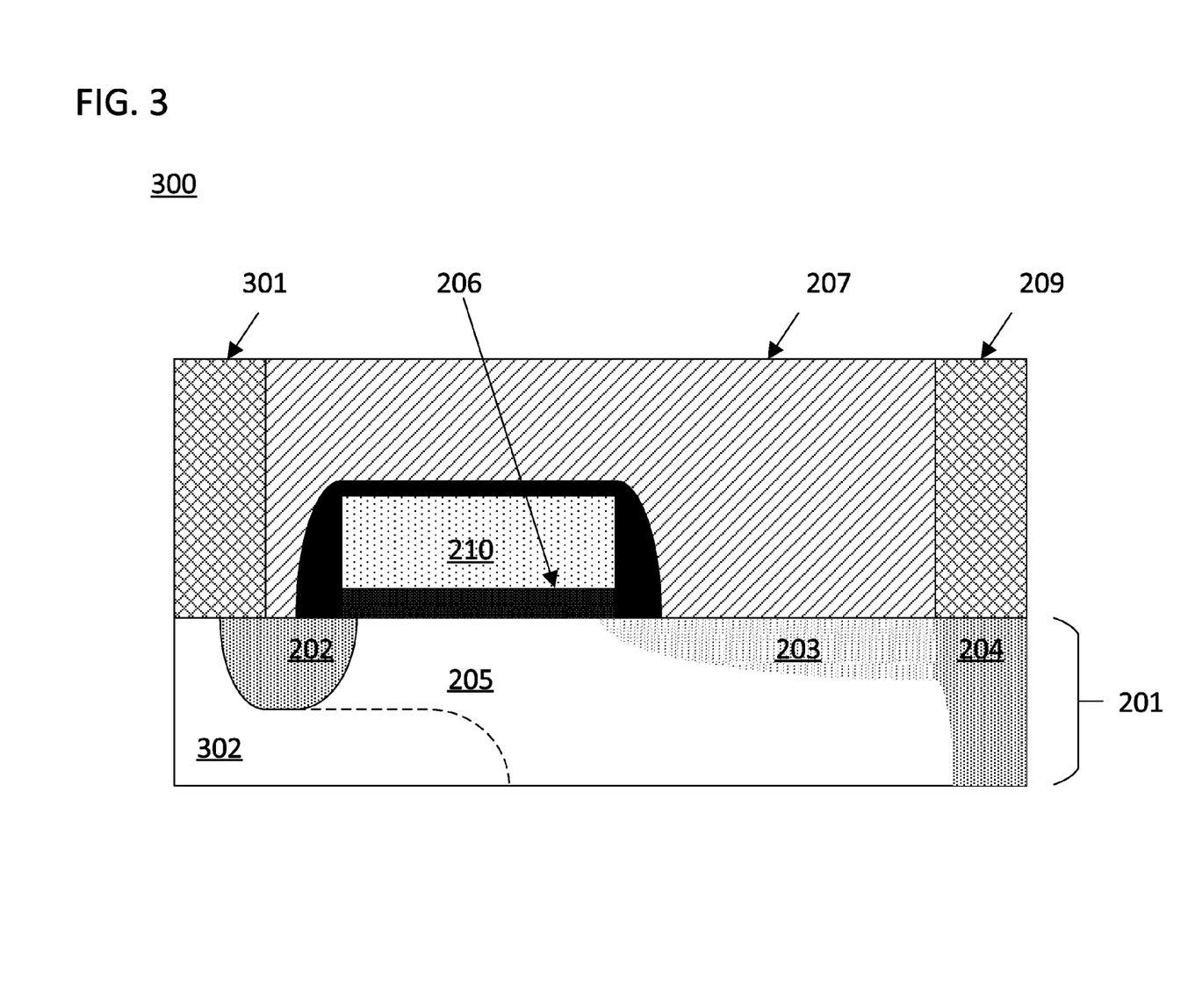
FIG. 3 illustrates a cross section of a transistor with a deep well body contact that is biased via the surface of the semiconductor wafer in which the transistor is formed.

FIG. 3 illustrates cross section 300 of a semiconductor structure that is similar to that shown with reference to FIG. 2 with the exception that source contact 208, which was formed in a trench into the planar surface of active layer 201, has been replaced with source contact 301 which does not extend into a trench in active layer 201. Also, deep well region 211 has been replaced with deep well region 302 which extends up to the planar surface of active layer 201 and is in contact with source contact 301 at that location. As shown, source contact 301 is in contact with deep well region 302 at the planar surface of the active layer 201. Since deep well region 302 still extends into body region 205 underneath the channel of the transistor in cross section 300, deep well region 302 is still able to prevent unwanted breakdown effects in the transistor. In addition, in certain approaches, deep well region 302 will be a region of heavy doping (such as a P+ or N+ region) such that a low impedance conductive path is created all the way from source contact 301 into a point that is located deep within body region 205.

The transistor of cross section 300, as compared to the transistor of cross section 200, has an advantage in that etching a trench into active layer 201 in order to adequately contact body region 205 can introduce additional costly processing steps and can also degrade device performance. Variability of the trench etch process may lead to variation in the final device performance which will cause a necessary downgrading of the minimum performance specifications for all of the devices produced by a manufacturing process that uses that trench etch process. Additionally, stress caused by the trench morphology may cause exfoliation of the semiconductor material in source region 202 during high temperature processing. As a result, the trench may cause additional deleterious degradation in device performance and manufacturing line yields. Fabricating the transistor of cross section 300 eliminates a trench etching step and provides a higher dose implant for the deep well contact. As a result, a solid and reliable ohmic contact can be made to body region 205 without the problems that a trench etch into active semiconductor material can cause.

Figure 4:
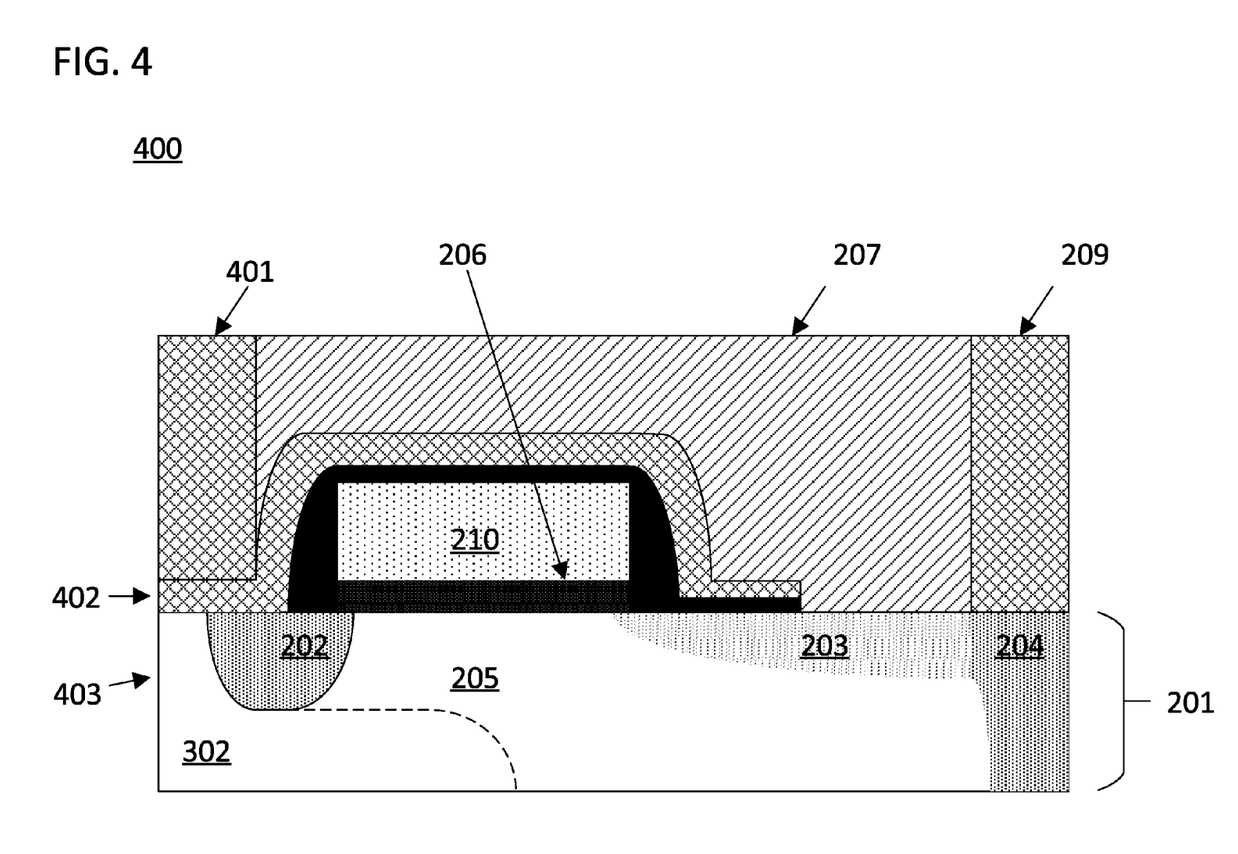
FIG. 4 illustrates a cross section of a transistor with a deep well body contact and a gate shield that is biased via the surface of the semiconductor wafer in which the transistor is formed.

FIG. 4 illustrates cross section 400 of a semiconductor structure that is similar to that shown with reference to FIGS. 2 and 3. However, the transistor in FIG. 4 includes a different source contact structure. Cross section 400 includes a source contact 401 and a gate shield 402. As illustrated, gate shield region 402 is separated from gate electrode 210 by a sub-region of dielectric region 206, but is in ohmic contact with source contact 401. Gate shield 402 is another feature that makes the transistor in cross section 400 more amenable to high power applications. By biasing the gate shield to a given voltage, high power signals on drain contact 209 are shielded from having an appreciable effect on the gate. Although gate shield 402 is illustrated as being ohmically coupled to source contact 401, gate shield 402 can also be independently biased. As drawn, gate shield 402 is distinguished from source contact 401 using a horizontal black line as a reminder that the gate shield and upper portion of source contact 401 can be formed in two different steps and can comprise two different kinds of material. However, the horizontal line separating gate shield 402 and 401 is inconsequential to the operation of the device in most situations because the two regions are effectively one contiguous region of highly conductive material with an uninterrupted ohmic contact from above dielectric material 207 all the way to the surface of active layer 201. As such, the combination of region 401 and the portion of region 402 that underlies region 401 can be conceptualized as a single source contact.

Figure 5:
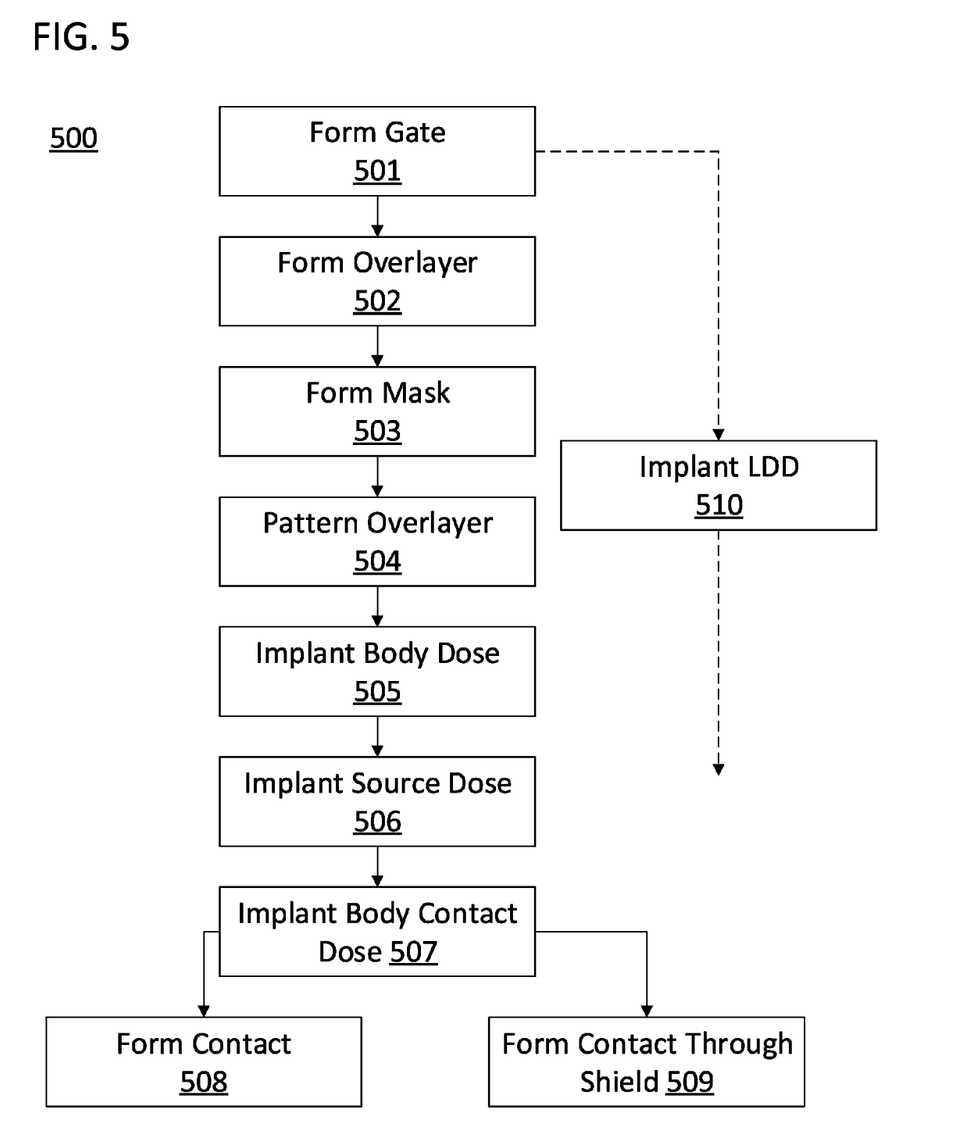
FIG. 5 illustrates a flow chart of a set of methods for forming a transistor with a deep well body contact.

FIG. 5 illustrates a flow chart of a set of methods 500 for forming a semiconductor device with a deep well body contact. Specific methods begins with step 501 in which a gate is formed for a transistor. The gate is formed on the surface of a wafer such as the wafer in which active layer 201 is formed in the examples above. As above, the wafer can be a bulk semiconductor wafer or an SOI wafer. The gate can include gate electrode 210 in the examples above. Certain methods continue with step 502 in which a dielectric overlayer is formed over the gate. The dielectric overlayer can include the darkened portions of insulator layer 206 from the examples above. The overlayer can alternatively take on any kind of variant shape so long as it provides adequate electrical isolation for the gate electrode from adjoining circuitry.

Formation of the dielectric overlayer can include the application of a patterning process either before or after the formation of the material used for that layer. For example, certain methods continue with step 503 in which a mask is formed on the insulating overlayer. In a specific example, a photoresist is deposited on the insulating overlayer in order to create this pattern. Certain methods then continue with step 504 in which the insulating overlayer is patterned. The pattern can be symmetrical, or it can be asymmetrical to expose a source side of the transistor while keeping a drain side of the transistor covered. The asymmetrical approach allows for the ultimate creation of low doped drain regions such as lightly doped drain 203, and also allows for additional improvements. The dielectric overlayer can be etched using the photoresist as a mask to form an exposed region on the surface of the wafer on the source side of the transistor. The etch used in this process can be selective to the semiconductor material of the substrate such that it stops on the planar surface of the substrate and does not form a trench. The etch process can also involve the use of multiple etch materials to prevent damage to the surface of the semiconductor wafer.

Once an exposed region of the surface of the wafer has been created, certain methods continue with step 505 in which a body dose of dopants is implanted into the exposed region of the surface of the wafer. The body dose of dopants then spreads underneath the gate to form a deep well for the transistor. The body dose of dopants has a first conductivity type. The deep well spreads down underneath the gate a certain distance from the planar surface of the wafer as controlled by the pattern.

After the body dose of dopants is implanted, certain methods continue with step 506 in which a source dose of dopants is implanted on the source side of the transistor to form a source region for the transistor. The source dose of dopants can be implanted using the same pattern used for the body dose of dopants or a different pattern. Different patterns for the source dose of dopants are described below with reference to FIGS. 8 and 9. In general, the source dose of dopants is, at least partially, conducted into a region that received the body dose of dopants. As a result, the source dose of dopants has to be strong enough to reverse the impact of the body dose of dopants at that location.

After the source dose of dopants is implanted, specific methods continue with step 507 in which a body contact dose of dopants is implanted on the source side of the transistor. The body contact dose of dopants forms a body contact region of the deep well that extends from the surface of the wafer to below the source region. Using FIG. 4 as an example for explaining the result of these steps, step 507 will form the surface portion 403 of deep well region 302 in FIG. 4; while step 506 will form source region 202 across the upper surface of active layer 201 through to the left side of cross section 400. As such, the upper portion 403 of deep well region 302 was a part of source region 202 after step 505, but then became part of deep well region 302 after the execution of step 507.

Method 500 concludes with the execution of only one of steps 508 and 509. Step 508 is utilized to produce a cross section such as the one in FIG. 3 while step 509 is utilized to produce a cross section such as the one in FIG. 4. In step 508, a source contact for the transistor is formed in contact with the deep well at the body contact region. In step 509, a source contact and gate shield for the transistor are formed. The gate shield and source contact are in contact with each other. The gate shield is in contact with the deep well region at the body contact region. Step 509 is drawn as the final step in the process, but portions of step 509 directed to the formation of the gate shield could have been conducted at an earlier step in the process. For example, the portion of the gate shield that overlies that gate could be formed just after step 502 such that the gate shield is isolated from the gate electrode. However, if step 502 involves the deposition of another isolation layer and the gate electrode has already been isolated at that time, the key portions of step 509 could be conducted prior to step 502.

Method 500 can also include the steps required to form a lightly doped drain region for the transistor such as lightly doped drain region 203 in FIG. 3. The required steps can be conducted after step 501, but otherwise can be interspersed throughout the method at any convenient point. The doping of the lightly doped drain region is generally independent of the doping that is conducted in steps 505-07 because devices such as the one shown in cross section 300 are asymmetric and the drain and source sides of the device are formed, at least in part, using separate steps. The lightly doped drain implant will generally be less heavy than the implant used in step 506 because the lightly doped drain region will generally have a lower dopant concentration than the source region. Since the step can be conducted at various points in method 500, step 510 of implanting a lightly doped drain dose of dopants into the surface of the wafer on the drain side of the transistor is drawn using a dotted line to indicate it can be interspersed within the main branch of method 500 at various locations. Step 510 is conducted using a dopant that causes the semiconductor material in which it is implanted to have an opposite conductivity type to that of the deep well region.

Figure 6:
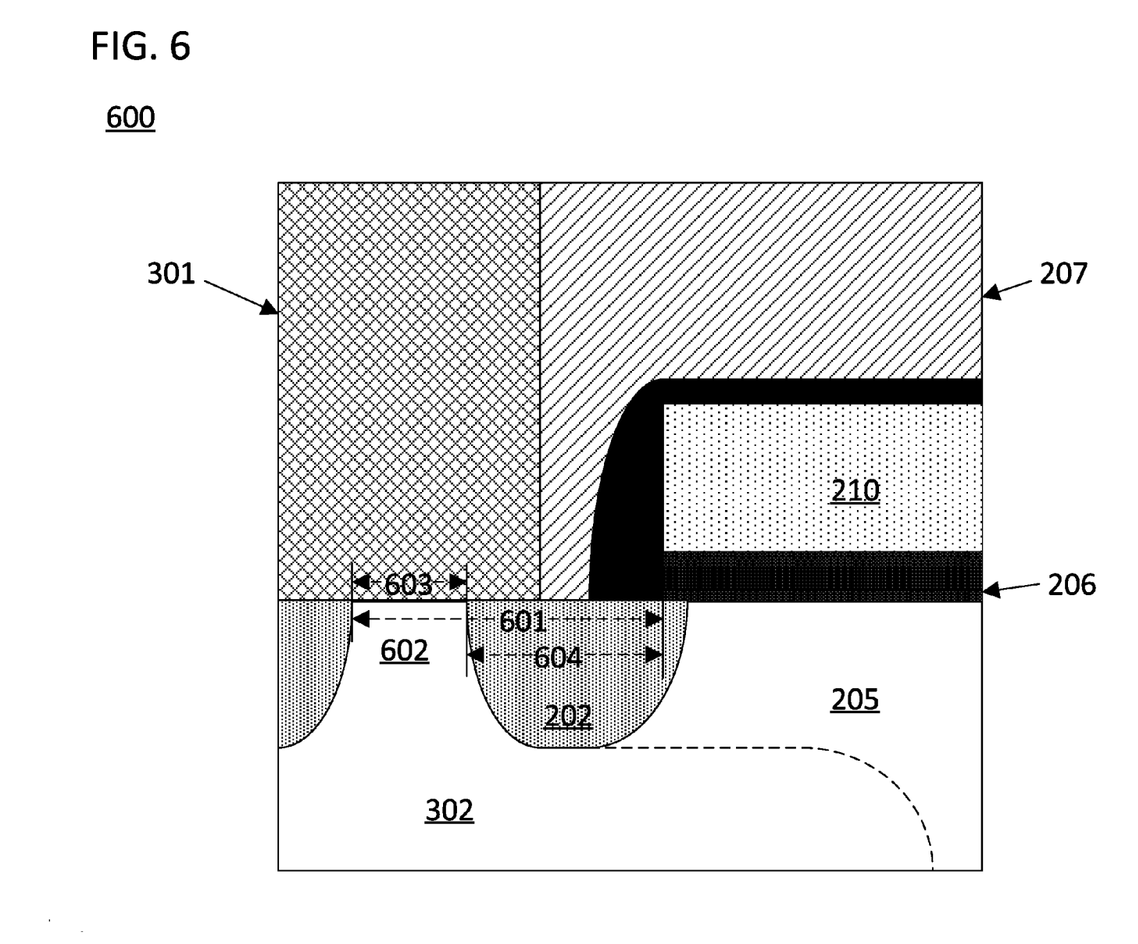
FIG. 6 illustrates a panned and zoomed view of the cross section in FIG. 3 to highlight certain dimensions of the deep well body contact in FIG. 3.

FIG. 6 displays cross section 600 which is a zoomed and panned version of cross section 300. The relative doping concentrations of the various implants in the processes illustrated by method 500 and the commensurate benefits of specific instances of such processes can be described with reference to the dimensions in cross section 600. Dimension 601 illustrates the location of the furthest expanse of the surface region 602 of deep well region 302 relative to gate electrode 210. As illustrated, the surface region 602 is located entirely within 1 micron of gate electrode 210. Dimension 603 illustrates the width of surface region 602 measured away from gate electrode 210. Note that in certain embodiments, which will be described below, the width of surface region 602 is larger at some points because it extends all the way through to body region 205 along the surface of the active layer. However, such embodiments are still in keeping with dimension 603 as the width of the surface region because dimension 603 is meant to indicate the minimum non-zero width of the surface region as measured at the midpoint of the width of the channel (i.e., it ignores edge dimensions and any "fingers" of surface region 602). As illustrated, surface region 602 is about 0.4 microns wide. In other approaches, surface region 602 is less than 1 micron wide as measured in accordance with dimension 603. Finally, dimension 604 illustrates the distance between the gate electrode and the surface region. As with dimension 602, dimension 604 ignores the "fingers" of the embodiments discussed below, and any irregularities around the ends of the channel. As such, dimension 604 is meant to illustrate a maximum distance from the edge of surface region 602 to the gate electrode as measured away from the gate electrode. Note that gate dielectric 206 is generally much thinner than it appears in FIG. 6 and is negligible for these measurements such that each can be considered as if measured along the planar surface of the wafer. Finally, dimensions 601, 603, and 604 are measured normal to the width of the transistor.

In specific methods that are represented by FIG. 5, the body contact dose of dopants is conducted into the surface of the semiconductor wafer at a point that has already received the source dose of dopants. As a result, the body contact dose of dopants has to be strong enough to counteract the source dose of dopants. In order to properly bias body region 205, this concentration needs to be high. In order to consume the least amount of surface area on the wafer, and therefore be the most cost effective, the body contact should be formed in a vertical column. However, regardless of how well an implant is directed, when a dopant species is introduced to the surface of a wafer it expands both vertically and laterally. Therefore, depending upon the thickness of source region 202, the implant used to form contact region 602 may have to spread for some distance laterally in order for it to form a contact from the surface of the wafer and down through source region 202 to a depth sufficient to provide a reliable pathway to bias body region 205.

Due to the countervailing desires of keeping the surface area of the contact limited while at the same time providing a reliable pathway to bias the body of the semiconductor device as well as a suitable source region for the transistor, deep well region 302 provides a significant advantage when used in combination with a body contact dose of dopants. Since deep well region 302 already provides a reliable conductive pathway from under the source region to under the channel region, the body contact dose only needs to be high enough to form a hole through to the bottom of source region 202. For example, the body contact dose of dopants can be less than 10 times as heavy as the source dose of dopants. At that point, the preexisting deep well region 302 provides a sufficiently high dose of dopants to the overall body contact to efficiently bias body region 205. As a result of this process, dimension 603 can be limited to less than 1 micron. Indeed, the inventors have determined that dimension 603 can be 0.4 microns, and dimension 601 can be less than 1 micron. Furthermore, the energy used for the body contact dose of dopants, when conducted into a silicon substrate using common dopant species, can be limited to less than 20 keV while still producing an adequate body contact to the device. However, the implant can be $BF_2$ or As at 30 keV and dimension 603 can still be less than 1 micron. Dimension 604 generally needs to be at least 0.2 microns because source contact 301 needs to contact source region 202 as well as the surface region of the deep well.

Figure 7:
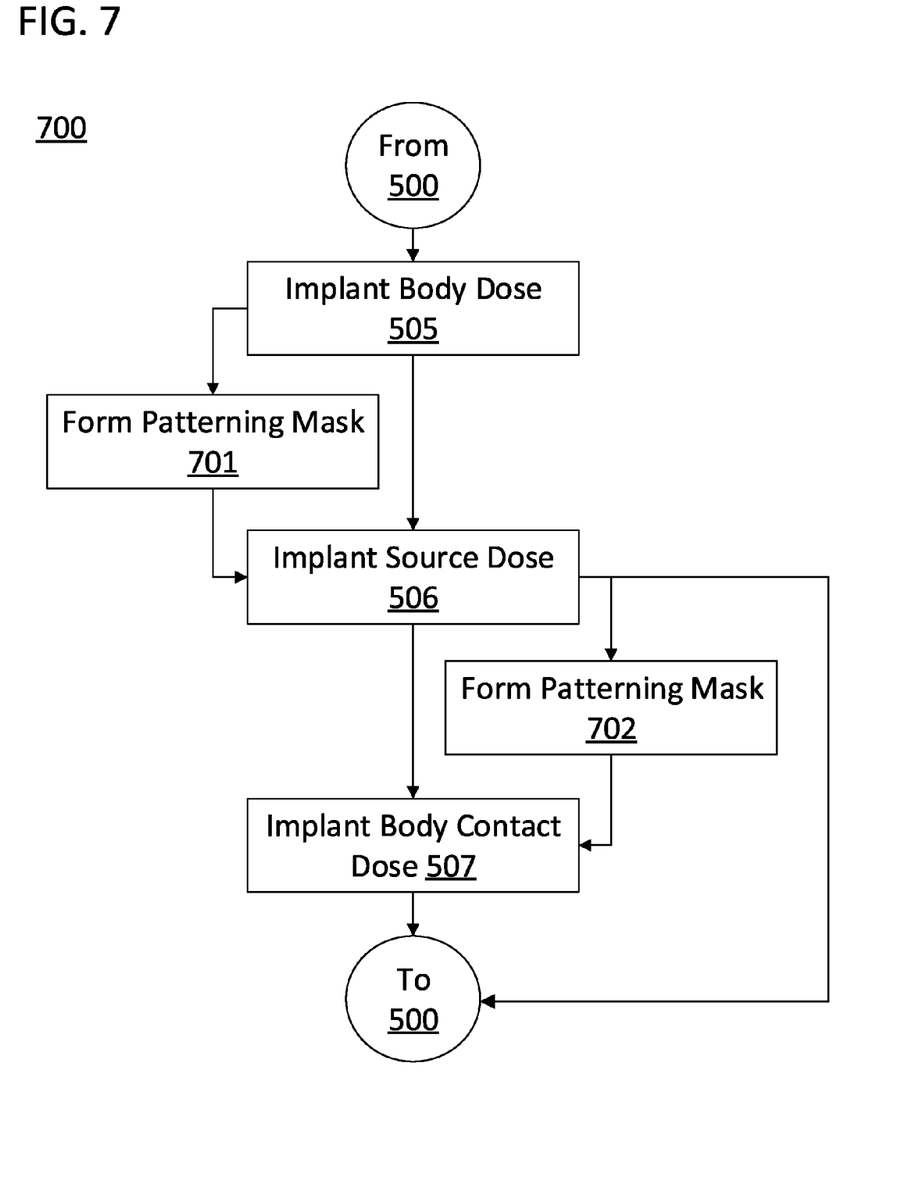
FIG. 7 illustrates a flow chart of a set of methods for forming a transistor with varying deep well surface region patterns.

FIG. 7 is a flowchart illustrating an additional set of methods 700 that are variations of the methods discussed with reference to FIG. 5. In general, the body dose, source dose, and body contact dose can each use different masks and, as will be described below, the body contact dose can optionally be omitted. In particular, if step 701 is utilized to pattern the source dose properly, step 507 can be skipped in its entirety.

The methods of flow chart 700 involve a patterned implant of the body contact dose or the source dose in order to pattern the surface region of the deep well relative to the source region. In one subset of methods that utilize step 701, a patterning mask is created in order to pattern the source implant in step 506. In specific approaches, this step involves the deposition of a photoresist material on the exposed region of the surface of the semiconductor wafer. The photoresist material is then patterned to form a finger pattern having a plurality of strips that extend away from the channel. Then, the implanting of the source contact dose in step 506 utilizes the finger pattern to form a plurality of fingers along a width of the transistor channel. An example of this finger pattern is described below with reference to FIG. 9. This set of approaches can then continue with step 702 and proceed with step 507, or step 507 can be skipped. This is because the patterned implant of the source region in step 506 will have already created a surface region of the deep well by leaving the original body dose in place underneath the mask. However, in certain approaches, another pattern, such as the negative of the pattern used in step 701, will be applied to allow for a surface region of the deep well with a different characteristic than what resulted from step 505.

In another subset of methods that utilize step 702, a patterning mask is created in order to pattern the body contact implant. In specific approaches, this step involves the deposition of a photoresist material on the exposed region of the surface of the semiconductor wafer. The photoresist material is then patterned to form a contiguous channel width pattern. This subset of methods continues with step 507 in which the second patterned photoresist is used to form a channel width pattern that extends contiguously along the width of the channel. The implanting of the body contact dose of dopants utilizes the contiguous channel width pattern such that the source region isolates a channel of the transistor from the body contact region.

Figure 8:
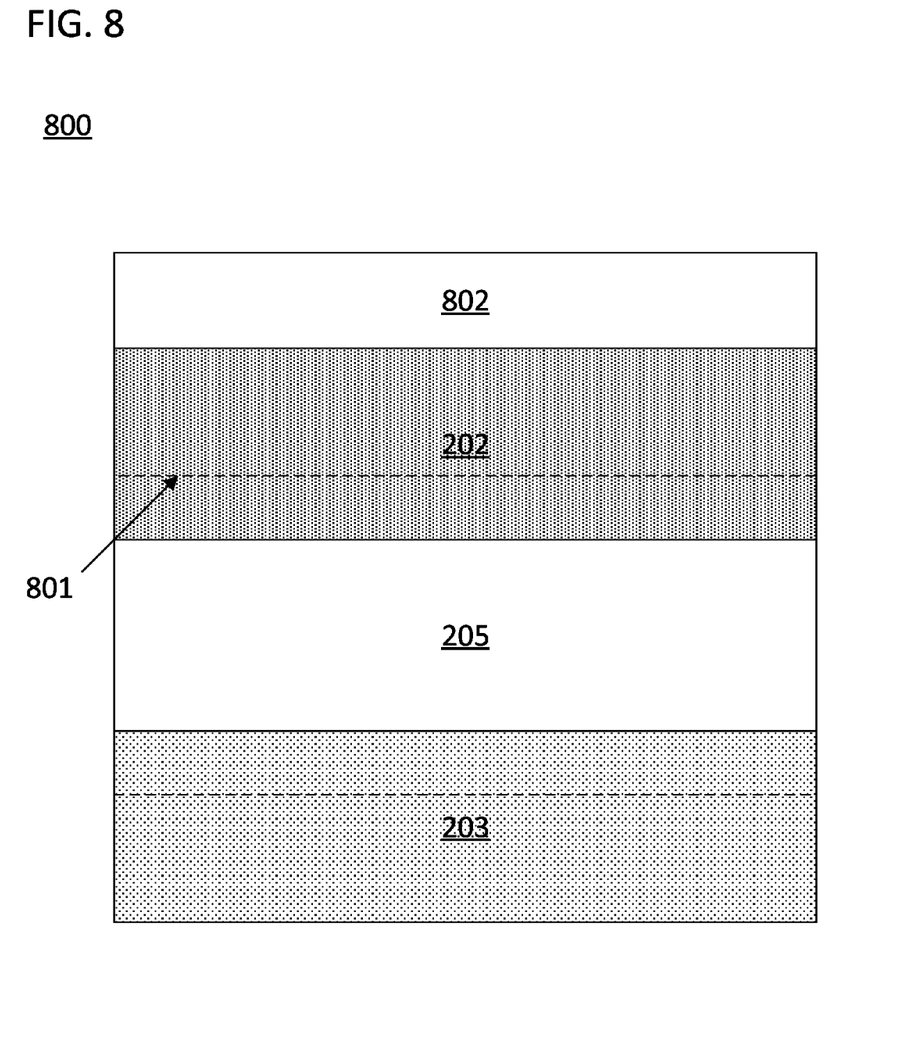
FIG. 8 illustrates a plan view of a transistor with a contiguous channel width deep well surface region pattern.
Figure 9:
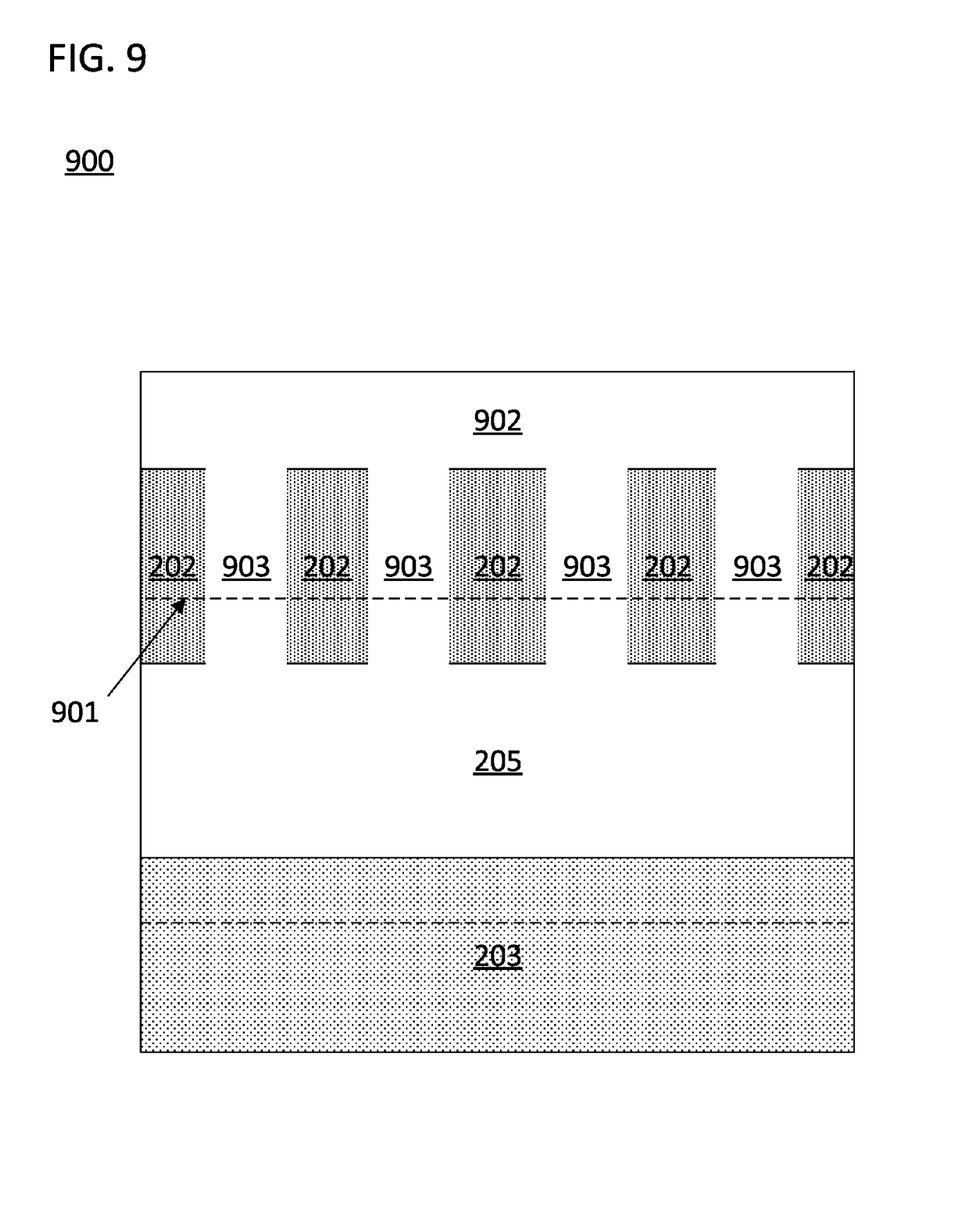
FIG. 9 illustrates a plan view of a transistor with a deep well surface region pattern.

FIGS. 8 and 9 illustrate plan views of semiconductor devices that have been fabricated in accordance with methods from flow chart 700. The plan views can correspond to cross sections 300 and 400 prior to the formation of the source contacts. In each diagram, the gate stack is transparent in order for the lower layers to be seen. However, dotted lines 801, 901 illustrates where the gate stack is located.

FIG. 8 illustrates a plan view 800 of the results of the sub-set of methods associated with conducting step 702 in combination with a channel width pattern. Surface region 802 of the deep well region is the portion of the deep well region that is located on the planar surface of the wafer. As drawn, source region 202 isolates the portion of body region 205 in which a channel of the transistor is formed from the surface region. This approach does not require a sophisticated pattern and can provide adequate bias to body region 205 through the deep well region.

FIG. 9 illustrates plan view 900 of the results of the sub-set of methods associated with conducting step 701 in combination with a finger pattern. Surface region 902 of the deep well region is again the portion of the deep well region that is located on the planar surface of the wafer. Unlike in plan view 800, the source region 202 of plan view 900 does not isolate the portion of body region 205 in which a channel is formed from the surface region. Instead, fingers of body contact material 903 lead directly to the portion of the body region in which the channel is formed when the transistor is in the on state. In plan view 900, a plurality of fingers 902 are located along a width of the transistor. The deep well region comprises a buried region and a surface region 902. As illustrated, each finger 903 in the plurality of fingers is a strip of the surface region 902 interspersed along the width of the transistor between a first and a second strip of the source region 202. Therefore, when the source contact is deposited on the planar surface of the wafer, the source contact will be in contact with the surface region 902 and can bias the body directly through the fingers 903.

The approaches described with reference to FIG. 9 provide a more direct path for biasing the body region of the transistor which makes the device even less susceptible to high power breakdown. However, the number of fingers should be limited to a reasonable number such that they do not limit the overall width of the transistor and thereby reduce the conductivity of the transistor. In most approaches, the total width of all of the fingers measured along the length of the trench should be limited to less than 5% of the overall width of the transistor. It is also beneficial to evenly distribute the fingers across the entire width of the transistor.

Figure 10:
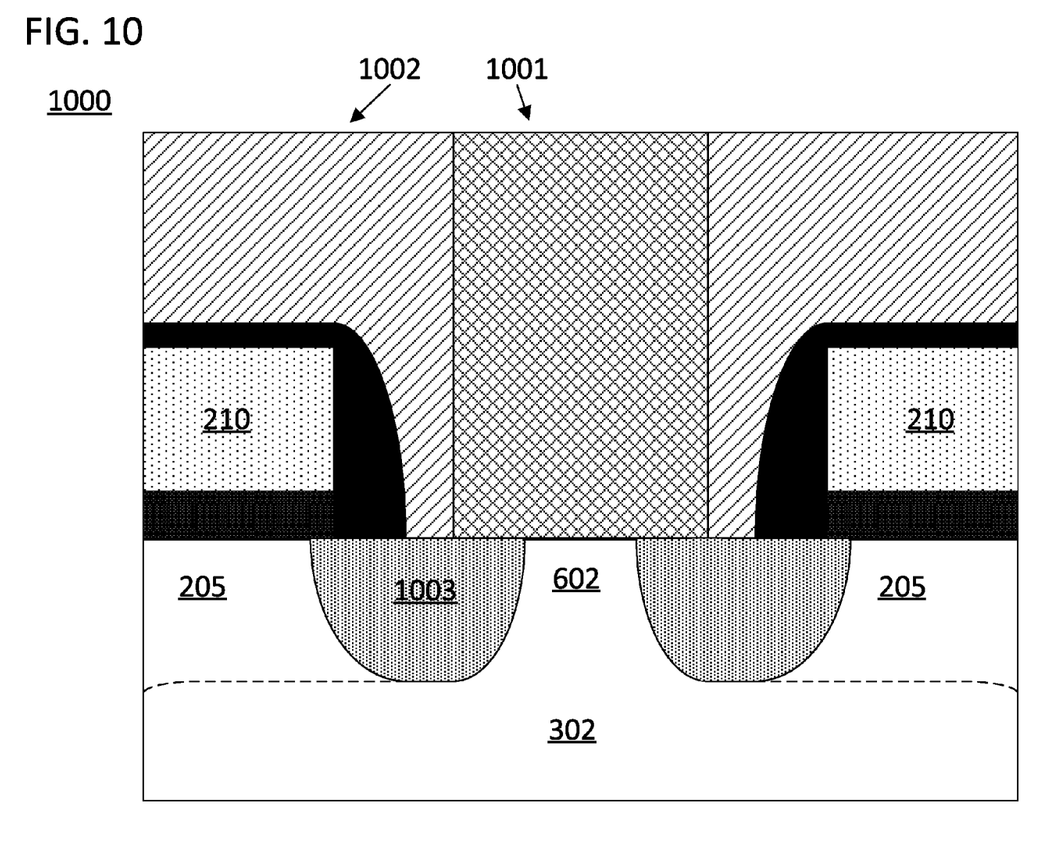
FIG. 10 illustrates a cross section of two adjacent transistors that share a body contact.

FIG. 10 illustrates a cross section 1000 which is a panned and zoomed version of cross section 300. In a situation in which the transistor in cross section 300 shares a source contact 1001 with an adjacent transistor 1002. Adjacent device 1002 is a mirror image of the transistor in cross section 300. Not all implementations of cross section 300 will include adjacent transistor 1002. However, those implementations that do include an adjacent transistor 1002 benefit from the low area requirements of the surface region of the body contact on the planar surface of the wafer. As shown, the size of the surface region of the body contact is a limiting factor to the density of the overall device. Therefore, the approaches discussed with reference to FIGS. 3 and 6 are particularly beneficial to tightly packed devices because surface region 602 can be limited to less than 0.4 microns and the combined minimum spacing set by dimension 602 and an overlapping set of dimensions 601 mean that spacing between adjacent devices can be less than 1.6 microns. In the illustrated approach, all of deep well region 302 is biased by shared contact 1001.

The characteristics of the source contact 1001, source region 1003, and the relative characteristics of source region 1003 and source contact 1001 can exhibit the same characteristics of source region 202 and body contact 302 mentioned above with reference to the other figures. For example, source region 1003 can isolate surface region 602 from the body of adjacent transistor 1002. As another example, source region 1003 can include interspersed fingers of surface region material that can provide a direct contact to the body of adjacent transistor 1002.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. A method of forming a transistor, wherein the method comprises:
    between a source side and a drain side of the transistor forming a gate for the transistor on a surface of a wafer;
    forming a dielectric overlayer over the gate, the source side, and the drain side of the transistor;
    patterning the dielectric overlayer with an asymmetric pattern that covers the gate and the drain side of the transistor, and exposes a region of the surface of the wafer on the source side of the transistor;
    implanting a body dose of dopants into the exposed region of the surface of the wafer, wherein the body dose of dopants spreads underneath the gate to form a deep well for the transistor, and wherein the body dose of dopants has a first conductivity type;
    implanting, subsequent to implanting the body dose of dopants, a source dose of dopants on the source side of the transistor to form a source region for the transistor;
    implanting, subsequent to implanting the source dose of dopants, a body contact dose of dopants into the exposed region of the surface of the wafer, wherein the body contact dose of dopants forms a body contact region of the deep well that extends from the surface of the wafer to below the source region; and
    performing only one of: (i) forming on the surface of the wafer a source contact for the transistor, wherein the source contact is in physical contact with the source region and the body contact region of the deep well; and (ii) forming a source contact and a gate shield for the transistor that are in physical contact with each other, wherein the gate shield is in physical contact with the source region and the body contact region of the deep well at the surface of the wafer.

2. The method of claim 1, further comprising:

depositing a photoresist on the exposed region of the surface of the wafer; and patterning the photoresist to form a channel width pattern that extends contiguously along a width of the transistor;

wherein the implanting of the body contact dose of dopants utilizes the contiguous channel width pattern such that the source region isolates a channel of the transistor from the body contact region.

3. The method of claim 1, further comprising:

depositing a photoresist on the exposed region of the surface of the wafer; and patterning the photoresist to form a finger pattern having a plurality of strips that extend away from the gate;

wherein the implanting of the source dose of dopants utilizes the finger pattern to form a plurality of fingers along a width of the transistor.

4. The method of claim 1, further comprising:

implanting a lightly doped drain dose of dopants into the surface of the wafer on the drain side of the transistor to form a lightly doped drain region;

wherein the deep well has an opposite conductivity type than the lightly doped drain region and the source region; and wherein a dopant concentration of the lightly doped drain region is less than a dopant concentration of the source region.

5. The method of claim 1, wherein:

the body contact dose of dopants is heavier than the source dose of dopants; and the body contact dose of dopants is less than ten times as heavy as the source dose of dopants.

6. The method of claim 5, wherein:

the exposed region of the surface of the wafer receives both the source dose of dopants and the body contact dose of dopants; and the exposed region of the surface of the wafer has a width that is less than 1 micron measured normal to a width of the transistor.

7. The method of claim 1, wherein:

the implanting of the body contact dose of dopants is conducted using less than 20 keV; and a surface of the body contact region that is located on the surface of the wafer is located entirely within 1 micron of a gate electrode of the gate.

* * * * *